United States Patent [19]
Kiyota et al.

[11] Patent Number: 5,909,112
[45] Date of Patent: Jun. 1, 1999

[54] CONFIGURATION AND TEST PROCESS FOR SEMICONDUCTOR OVERCURRENT DETECTING CIRCUIT

[75] Inventors: Shigeyuki Kiyota, Yokohama; Hironori Saito, Kanagawa, both of Japan

[73] Assignee: Nissan Motor Co., Ltd., Kanagawa, Japan

[21] Appl. No.: 09/042,695

[22] Filed: Mar. 17, 1998

[30] Foreign Application Priority Data

Mar. 24, 1997 [JP] Japan ................................ 9-069619

[51] Int. Cl.$^6$ .................. G05F 1/56; G05F 3/16
[52] U.S. Cl. ............................. 323/315; 323/225
[58] Field of Search .................. 323/223, 225, 323/282, 285, 312, 315, 316

[56] References Cited

U.S. PATENT DOCUMENTS

| | | | |
|---|---|---|---|
| 5,159,516 | 10/1992 | Fujihira | 323/315 |
| 5,245,523 | 9/1993 | Juzswik | 323/315 |
| 5,559,500 | 9/1996 | Kase | 323/315 |

*Primary Examiner*—Matthew Nguyen
*Attorney, Agent, or Firm*—McDermott, Will & Emery

[57] ABSTRACT

A MOSFET integrated circuit device has a main MOSFET, a mirror MOSFET, a current sensing resistor, a reference voltage source, a comparator for detecting an overcurrent condition by comparing a potential at the source of the mirror MOSFET with a reference potential of the reference voltage source, and a control circuit section for turning off the main MOSFET in case of the overcurrent condition. The device further comprises a group of pads allowing a test of the overcurrent detecting function by application of a test current much lower than an overcurrent. The pad group comprises a first pad for measuring the potential at the source of the mirror MOSFET, a second pad for measuring the reference potential and a third pad for detecting a change in the output of the comparator.

17 Claims, 5 Drawing Sheets

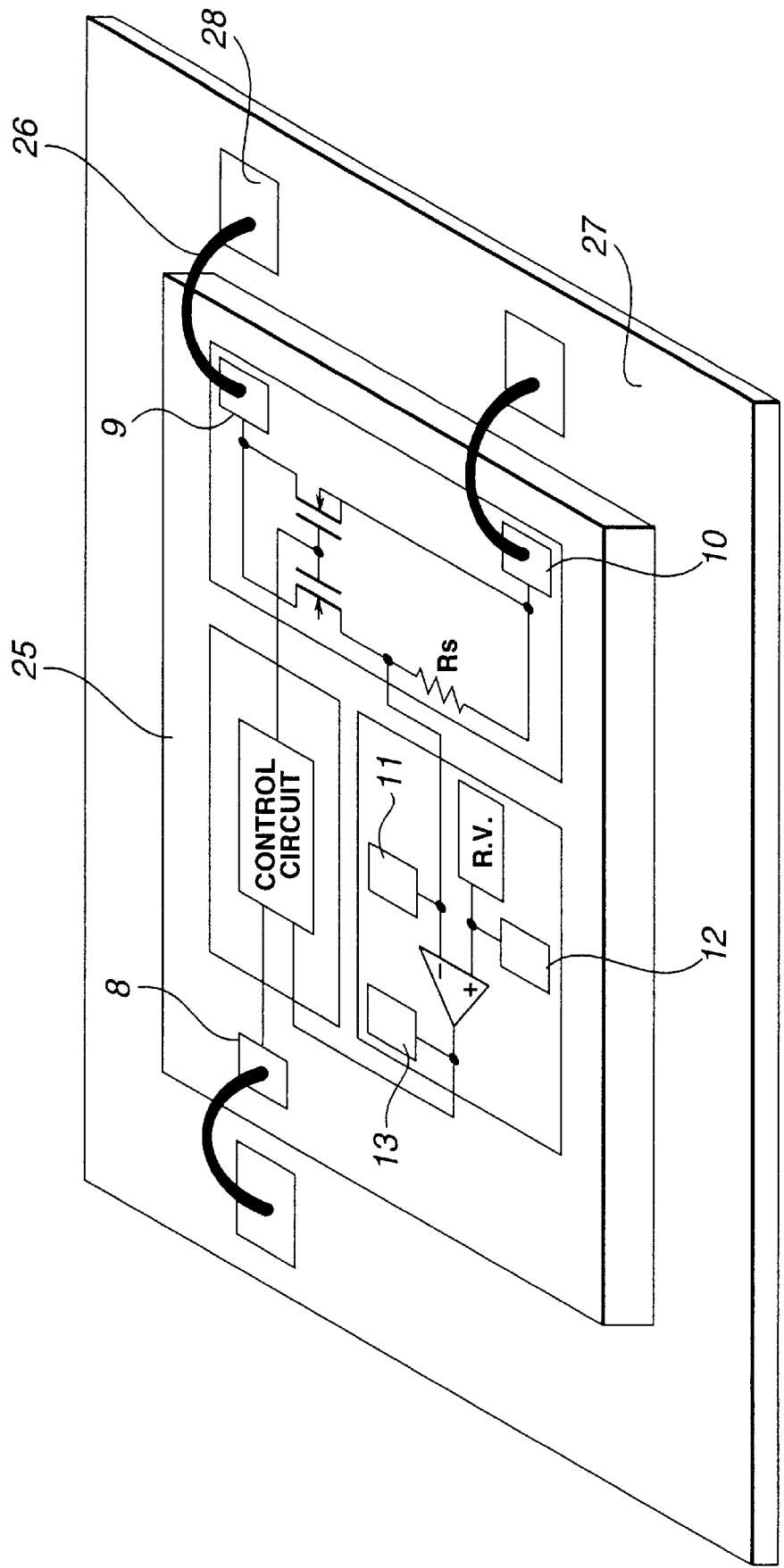

CONFIGURATION AND TEST PROCESS FOR SEMICONDUCTOR OVERCURRENT DETECTING CIRCUIT

The contents of a Japanese Patent Application No. 9-569619 with a filing date of Mar. 24, 1997 are hereby incorporated by reference.

BACKGROUND OF THE INVENTION

1. Field of the Invention

The present invention relates to an overcurrent detecting circuit, and test system and process for testing overcurrent detecting function. More specifically, the present invention relates an integrated MOSFET circuit having an overcurrent detecting circuit section of a mirror MOSFET, and test system and process for testing integrated circuit devices of such a type.

2. Related Art

A MOSFET integrated circuit device of one example comprises a main MOSFET having a drain connected with an output terminal and a source connected with a ground terminal, a mirror MOSFET, a current sensing resistor, a comparator for detecting an overcurrent condition by comparing a potential at the source of the mirror MOSFET with a reference potential of a reference voltage source, and a control circuit section for protecting the circuit by turning off the main MOSFET in case of the overcurrent condition. The drains of the main MOSFET and the mirror MOSFET are connected together to the output terminal which is connected through the load to a power source. A drive current flows along a path of power source→load→output terminal→main MOSFET→ground terminal.

In a test system used in a fabricating process, for testing the overcurrent detection function of such a MOSFET integrated circuit device, it is required to supply a drive current at an overcurrent level from the output terminal to the main MOSFET, and checks if the main MOSFET is turned off by the overcurrent detecting circuit. In consideration of requirements on the main MOSFET, the current threshold above which an overcurrent condition is judged to exist is set at a high magnitude of about several amperes or higher, near the maximum current which the main MOSFET, and bonding wires of the output terminal and the ground terminal can handle. Application of such a high drive current in a package testing operation is liable to reduce the lifetime of a socket used for connection of a semiconductor package.

Moreover, a probe test of such an integrated circuit device in the state of a wafer is infeasible because a current to be detected as an overcurrent exceeds an allowable current of a contact portion between a pad of the semiconductor device and a probe of the tester. Recently, many semiconductor devices are used in the form of bare-chip mount without packaging. However, the testing of overcurrent detecting function is not possible because of lack of an appropriate way for probe testing.

SUMMARY OF THE INVENTION

It is an object of the present invention to provide circuit configuration, test system and test process for an overcurrent detecting circuit enabling testing of overcurrent detecting function by application of a test current much lower than the level of an overcurrent range.

According to the present invention, an integrated circuit device with overcurrent detecting function, comprises: a main (switching) element, such as a main MOSFET, for driving a load, a current mirror element, such as a mirror MOSFET, for conducting a fraction of a main current flowing through the main element, a current sensing resistor, a reference voltage source (or reference voltage supplying circuit section), a comparator, a control circuit section and a group of pads.

The main element comprises a first electrode such as a drain for receiving a current from the load, a second electrode, such as a source, connected to a ground terminal, and a control electrode such as a gate.

The mirror element comprises a control electrode, such as a gate, connected with the control electrode of the main MOSFET, a first electrode, such as a drain, connected with the first electrode of the main MOSFET, and a second electrode such as a source.

The current sensing resistor is connected between the second electrode of the mirror element and the ground terminal of the integrated circuit device.

The reference voltage source comprises an output point for providing a reference voltage.

The comparator comprises a first input point connected with the source of the mirror MOSFET, a second input point connected with the output point of the reference voltage source, and a comparator output point for delivering a comparator output signal such as an overcurrent detection signal.

The control circuit section is connected between the output point of the comparator and the control electrode of the main element, and comprises a control subsection (7) for turning the main element on and off in response to an external drive signal and the comparator output signal.

The pad group comprises a first pad (11) connected with the second electrode of the mirror element, and a second pad connected with the output of the reference voltage source. The pad group of an embodiment of the invention further comprises a third pad connected with the control circuit section. Each pad is an externally available point of connection used for taking out a potential at a predetermined point in the circuit.

A test process according to an embodiment of the present invention comprises:

a measuring step which comprises a first sub-step of measuring an on-state first comparator input potential Vsense1 at the first input of the comparator in a predetermined on state in which the main element is in an on state and a predetermined reference current Id1 is supplied to the first electrode of the main element, a second sub-step of measuring an off-state second comparator input potential Vref0 at the second input of the comparator in an off state in which the main element is in an off state, a third sub-step of measuring an on-state second comparator input potential at the second pad in the on state in which the main element is in the on state and the predetermined reference current Id1 is supplied to the first electrode of the main element; and a calculating step of calculating a detection current value Isense from Id1, Vsense1, Vref0 and Vref1.

The measuring step in an illustrated example further comprises a fourth sub-step of measuring an offset Voffset of the comparator by applying an external first potential to the first input of the comparator and an external second potential to the second input while monitoring a condition of the control circuit section to detect a change at the output of the comparator. In this case, the calculating step comprises a sub-step of calculating the detection current value Isense given by;

$$I_{sense}=Id1\times(Vref0-Voffset)/[Vsense1-(Vref1-Vref0)].$$

The reference current Id1 need not be a high current within an overcurrent range. This test process enables the test of the overcurrent detection function without applying an overcurrent to the circuit. It is possible to set the reference current Id1 at a very low level. The reference current Id1 may be at a current level which is very low but still allows accurate measurement of a potential at each pad. For example, the magnitude of the reference current Id1 is a tenth of an actual overcurrent. Under a small current condition, a probe tester system can measure voltages at various points in the circuit and check the overcurrent detecting function. The test system and process according to the invention improves the duration of sockets in package testing, and enables a probe test of wafers before division into individual chips.

BRIEF DESCRIPTION OF THE DRAWINGS

FIG. 5 is a schematic perspective view showing a package substrate and a semiconductor chip having the circuit of FIG. 1.

DETAILED DESCRIPTION OF THE INVENTION

Figure 1:
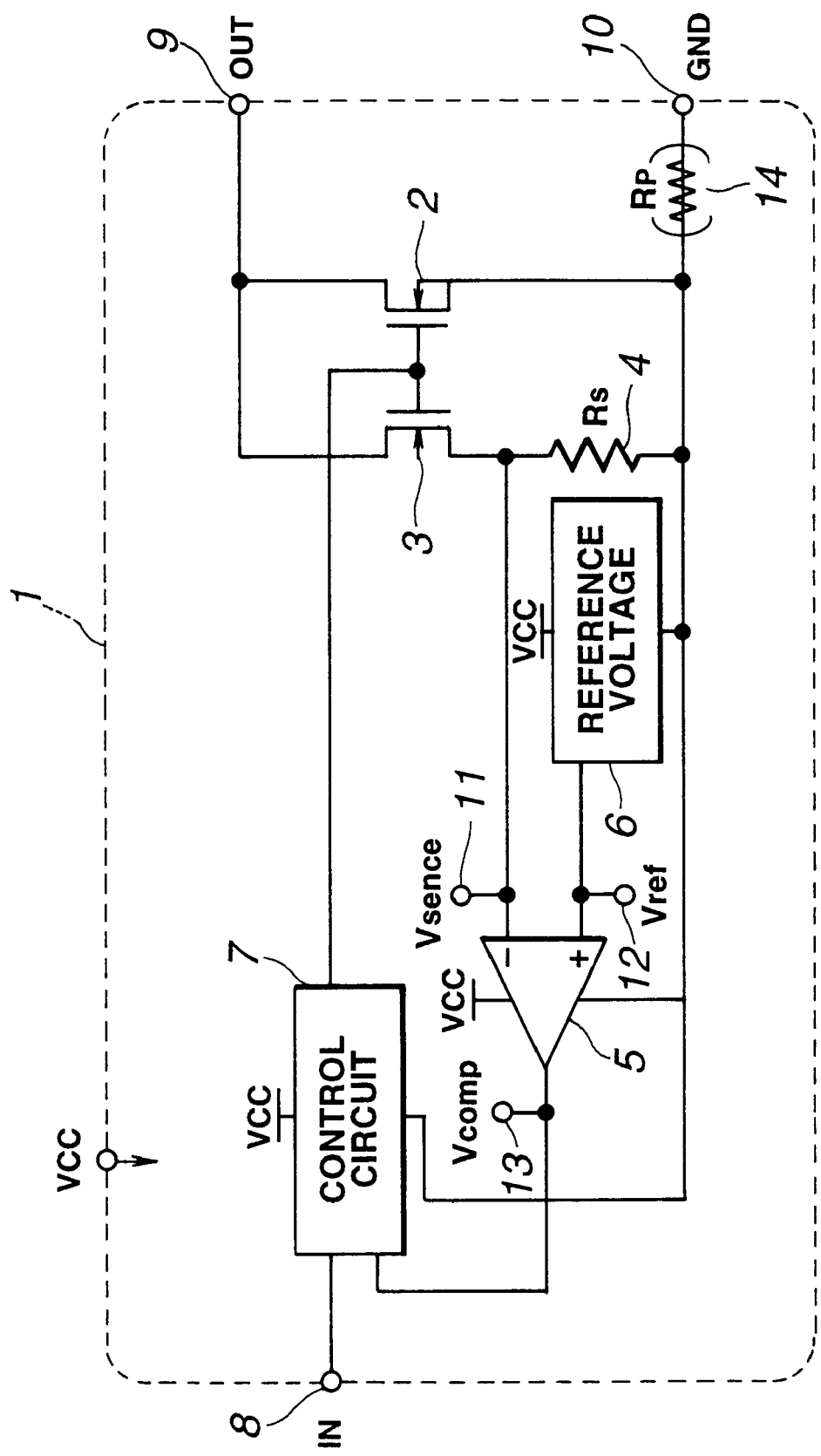
FIG. 1 is a circuit diagram showing an overcurrent detecting circuit of a first practical example according to one embodiment of the present invention.

FIG. 1 shows a MOSFET circuit having an overcurrent detecting function according to an embodiment of the present invention.

The MOSFET circuit 1 shown in FIG. 1 has an input terminal 8, an output terminal 9 and a ground terminal 10.

Main components of the MOSFET circuit 1 are; a main MOSFET 2, a mirror MOSFET 3, a current sensing resistor 4, a comparator 5, a reference voltage source 6 and a control circuit (or control subsection) 7. The MOSFET circuit 1 is an integrated circuit, and these components are formed in and on a single semiconductor substrate.

The main MOSFET 2 is a device for driving a load to be connected with the output terminal 9. The main MOSFET 2 comprises a drain electrode connected with the output terminal 9, a source electrode connected with the ground terminal 10, and a gate electrode connected with the control circuit 7.

The mirror MOSFET 3 comprises a drain electrode connected with the drain electrode of the main MOSFET 2, a gate electrode connected with the gate electrode of the main MOSFET, and a source electrode connected with the current sensing resistor 4.

The current sensing resistor 4 is connected between the source electrode of the mirror MOSFET 3 and the ground terminal 10. The current sensing resistor 4 has a resistance Rs.

The comparator 5 comprises an output, a first input connected with the source electrode of the mirror MOSFET 3 and a second input connected with an output of the reference voltage source.

The reference voltage source 6 is connected between the second input of the comparator 5 and the ground terminal 10, and designed to supply a reference voltage to the second input of the comparator 5.

The control circuit 7 comprises a first input connected with the input terminal 8, an output connected to the gate electrode of the main MOSFET 2, and a second input connected with the output of the comparator 5. The control circuit 7 is designed to turn the main MOSFET 2 on and off in response to an external drive signal inputted from the input terminal 8, and a comparator output signal (or overcurrent detection signal) sent from the comparator 5.

The mirror MOSFET 3 has a size which is a predetermined fraction (1/N) of the size of the main MOSFET 2. The mirror MOSFET 3 is designed to conduct a fraction (1/N) of a main current flowing through the main MOSFET 2. Normally, N is about $10^2 \sim 10^3$.

A pad group is further formed in the MOSFET circuit 1. The pad group in the example shown in FIG. 1 includes a first sensing pad 11 connected with the source electrode of the mirror MOSFET 3, for measuring a potential at the source electrode of the mirror MOSFET 3, a second sensing pad 12 connected with the output point of the reference voltage source 6, for measuring a potential at the output point of the reference voltage source 6, and a third sensing pad 13 connected with the output point of the comparator 5, for measuring a potential at the output point of the comparator 5.

The MOSFET circuit 1 can detect an overload current condition of a drive current Id flowing through the main MOSFET 2 in the following manner as in the conventional device. When a drive current Id from a load flows through the main MOSFET 2 in the on state, a mirror current Is flows through the mirror MOSFET 3. The mirror current Is is determined by a size ratio (or mirror ratio). That is, Is=Id/N. The mirror current Is further flows through the current sensing resistor 4, and a sensed voltage Vs (Vs=Is×Rs) is obtained from a point between the source of the mirror MOSFET 3 and the current sensing resistor 4, and inputted to the first input of the comparator 5. The comparator 5 compares the sensed voltage Vs with the reference voltage Vref supplied from the reference voltage source 6 and inputted to the second input of the comparator 5. The mirror current Is increases in proportion to the drive current Id. Therefore, the sensed voltage Vs is increased as the drive current Id increases. When the actual voltage Vs exceeds the reference voltage Vref, the comparator 5 inverts its output. In response to this output signal (or overcurrent detection signal) of the comparator 5, the control circuit 7 turns off the main MOSFET 2 irrespective of the state of the input drive signal from the input terminal 8. In this way, this MOSFET circuit 1 can detect an overcurrent condition of the drive current Id, and protect the main MOSFET 2 and bonding wires connected with the output terminal 9 and the ground terminal 10 from damage due to overload current.

The MOSFET circuit design according to the embodiment facilitates a test for checking the overcurrent detecting function in a semiconductor fabricating process. Specifically, this circuit design enables the test at a small current level.

A test system according to this embodiment of the present invention utilizes the first pad 11, the second pad 12 and the third pad 13 to sense voltages at various points in the circuit.

A test process performed by the test system comprises the following five steps.

The first step is for measuring an on-state variable potential Vsense1 which is a potential at the first sensing pad 11 in the state in which the main MOSFET 2 is put in the on state and a predetermined reference current Id1 is supplied to the drain electrode of the main MOSFET 2 from the output terminal 9.

The second step is for measuring an off-state reference potential Vref0 which is a potential at the second sensing pad 12 in the state in which the main MOSFET is in the off state.

The third step is for measuring an on-state reference potential Vref1 which is a potential at the second sensing pad 12 in the state in which the main MOSFET 2 is in the on state and the predetermined reference current Id1 is supplied to the drain electrode of the main MOSFET 2 from the output terminal 9.

The fourth step is for measuring an offset Voffset of the comparator 5 by applying potentials from the outside to the first pad 11 and the second pad 12 while monitoring the third pad 13 (as mentioned more in detail later).

It is possible to choose an appropriate order of these four steps. The first, second, third and fourth steps need not be carried out in the order of mention. Some can take place simultaneously. For example, the first and third steps can be performed simultaneously while the MOSFET circuit 1 is held in the state in which the main MOSFET 2 is in the on state and the predetermined reference current Id1 is supplied to the drain electrode of the main MOSFET 2 from the output terminal 9.

The fifth step is for calculating a detection current Isense of the overcurrent limiting function by using the following relationship;

$$\text{Isense}=\text{Id1}\times(\text{Vref0}-\text{Voffset})/[\text{Vsense1}-(\text{Vref1}-\text{Vref1})] \qquad (1)$$

The detection current Isense is a current level to be detected by the overcurrent detecting circuit to discriminate an overcurrent condition. When the monitored current is equal to or higher than the detection current Isense, it is judged that the overcurrent condition exists. Accordingly, the test system can judge whether the overcurrent detecting function is normal or not, by comparing the detection current Isense calculated by the equation (1) with a predetermined design value.

Figure 2:
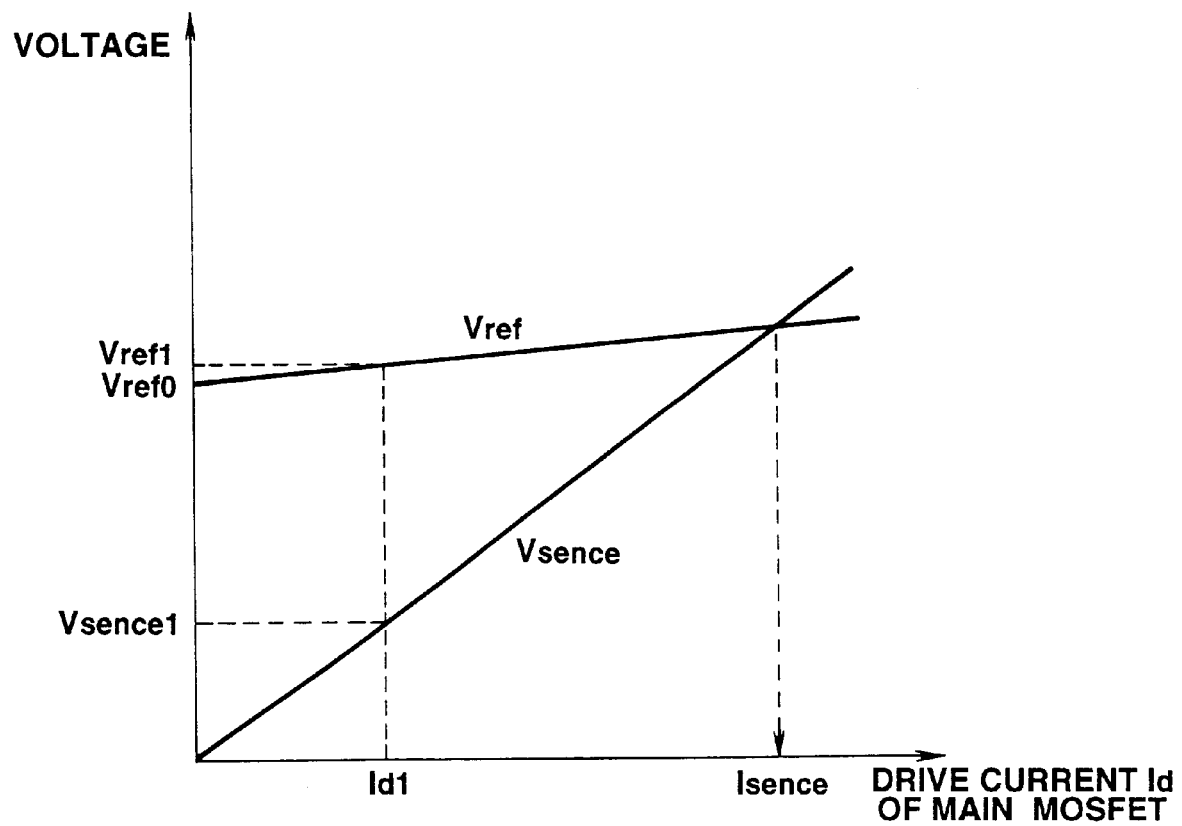
FIG. 2 is a graph for showing relationships of a source potential Vsense of a mirror MOSFET shown in FIG. 1 and a reference potential Vref with respect to a drive current of a main MOSFET shown in FIG. 1.

FIG. 2 is a graph showing characteristics of the variable potential Vsense at the source electrode of the mirror MOSFET 3 and the output potential Vref of the reference voltage source 6 with respect to the drive current Id through the main MOSFET 2. FIG. 2 serves to explain the test process according to this embodiment.

As shown in FIG. 2, the relationship between the variable potential Vsense at the source electrode of the mirror MOSFET 3 and the drive current Id is in the form of an inclined first straight line passing through the origin at which the coordinate axes intersect each other. The relationship between the reference potential Vref of the reference voltage source 6 and the drive current Id is an approximately horizontal second straight line which is approximately parallel to the x axis. The detection current Isense is determined by an intersection between the first line of the variable potential Vsense and the second line of the reference potential Vref. As shown in FIG. 2, the detection current Isense is equal to the x coordinate (abscissa) of the intersection point between the first line of the variable potential Vsense and the second line of the reference potential Vref. When the drive current Id increases, the variable voltage Vsense increases in proportion thereto, and becomes equal to the reference voltage Vref at the intersection point. Above the detection current Isense, the actual voltage Vsense is higher than the reference voltage Vref. If the second line of the reference voltage Vref is exactly horizontal and parallel to the x axis (in an ideal state free from an error due to a parasitic resistance), the detection current Isense is given by;

$$\text{Isense}=\text{Id1}\times\text{Vref0}/\text{Vsense1} \qquad (2)$$

In reality, the second line of the reference voltage Vref is not completely parallel to the horizontal x axis because of involvement of a parasitic resistance in the reference voltage Vref. It is desirable that the output potential of the reference voltage source 6 is constant independently of the drive current Id, and hence the second line is horizontal. However, there exists a parasitic resistor 14 (having a resistance Rp) in the form of an interconnection resistance between the source electrode of the main MOSFET 2 and the ground terminal 10. The flow of the drive current Id through the parasitic resistor 14 develops a potential difference Id×Rp across the parasitic resistor 14, and the ground potential of the reference voltage source 6 is raised by Id×Rp. Eventually, the reference potential Vref of the reference voltage source 6 varies in accordance with the drive current Id. As shown in FIG. 2, the reference potential Vref increases as the drive current Id increases.

Normally, the main MOSFET 2 is required to handle a high current, and the drive current at the overcurrent detection level is as high as several amperes or higher. Therefore, the deviation due to the raise Id×Rp of the ground potential amounts to a non-negligible value even if the resistance of the parasitic resistor 14 is reduced to a smallest possible value. The slight inclination of the second line of the reference voltage Vref is the result of this deviation in the ground potential.

This test system, therefore, performs measurement to determine the value Vref0 of the reference potential Vref of the reference voltage source 6 in the state in which the drive current Id is zero, and the value Vref1 of the reference potential Vref in the state in which the drive current Id is equal to the predetermined reference drive current value Id1. From these measured values, the test system determines a correction quantity (Vref1−Vref0) appearing in the equation (1) to compensate for the variation in the output voltage Vref of the reference voltage source 6 due to the raise of the ground potential.

The offset voltage Voffset of the comparator 5 is another correction quantity in the equation (1). In this example, the offset voltage Voffset is determined in the following manner. The test system applies potentials from the outside to the first pad 11 of the source electrode of the mirror MOSFET 3 and the second pad 12 of the output of the reference voltage source 6 while monitoring the voltage of the third pad 13 of the output of the comparator 6. For example, the first pad 11 is held constant at zero V, and the voltage applied to the second pad 12 is increased from −0.05V gradually to the plus side. The offset voltage Voffset is set equal to the magnitude of the voltage applied to the second pad 12 when the output of the comparator 6 is inverted.

Figure 4:
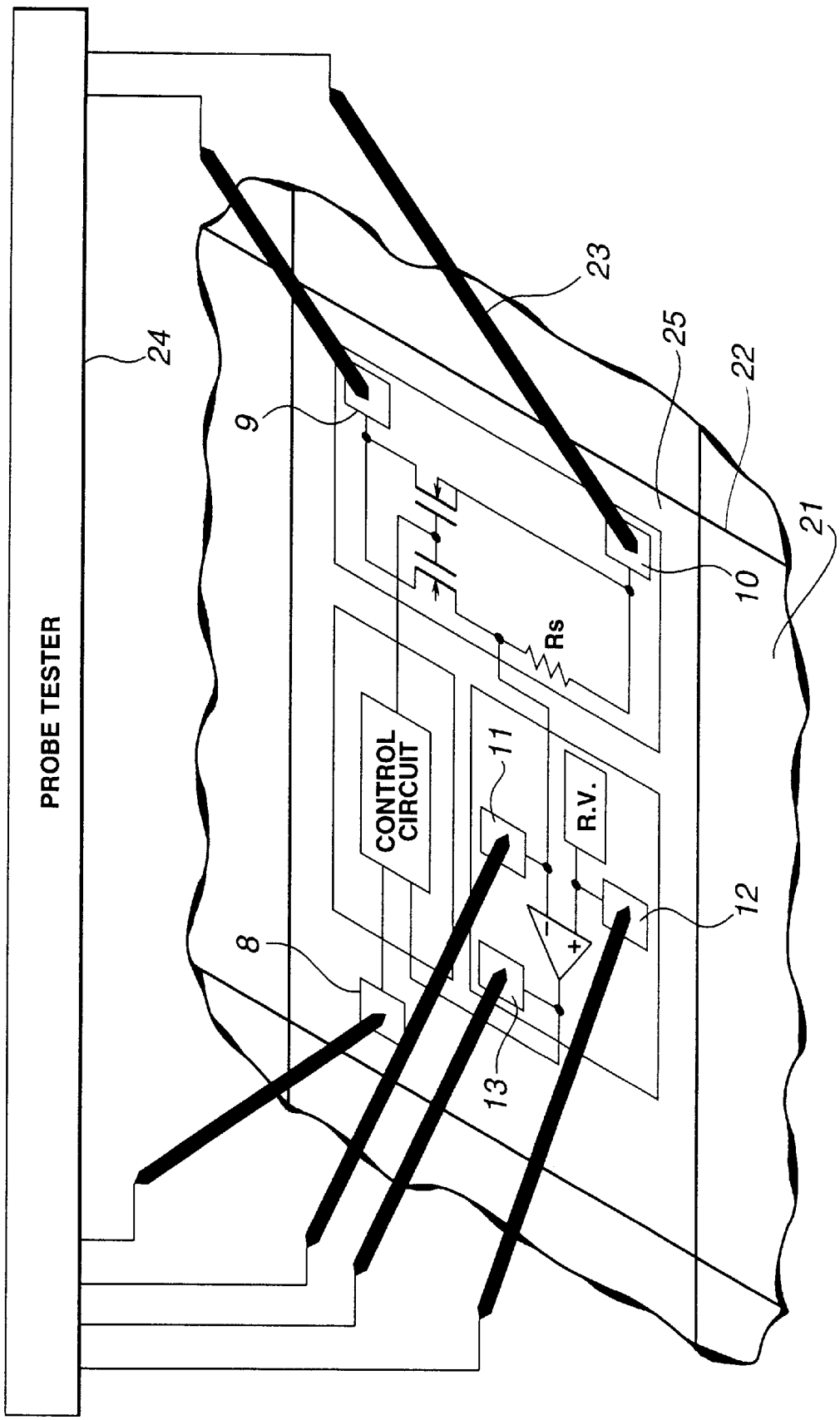
FIG. 4 is a schematic perspective view showing a test system for testing the circuit of FIG. 1 in a semiconductor wafer.

FIG. 4 schematically shows the test system, as an example. In FIG. 4, the circuit 1 shown in FIG. 1 is still in the form of a semiconductor wafer 21, and under a probe test. Each of the input terminal 8, the output terminal 9 and the ground terminal 10 is formed with a pad. The test system of this example comprises a system of probes 23, and a probe tester unit 24. The test system can make an electric connection with each of the pads 8, 9, 10, 11, 12 and 13 by bringing one of the probes 23 in contact with one of the pads. The tester unit 24 is programmed to perform the above-mentioned test process for testing the overcurrent detection function. After the testing, the semiconductor wafer 24 is divided into individual semiconductor chips 25 along scribe lines 22. In the example shown in FIG. 4, the system includes six probes for the six pads of the circuit in the manner of one-to-one correspondence.

FIG. 5 shows, as an example, a semiconductor chip 25 in actual use. The circuit of FIG. 1 is formed on and within the semiconductor chip 25, which is mounted on a package substrate 27 by a bare chip mount technique. The semiconductor chip 25 is die-bonded onto the package substrate 27, and each of the terminals 8, 9 and 10 is connected by a bonding wire 26 to one of package side pads 28 formed on the package substrate 28. FIG. 5 shows only one chip on the substrate 28 for simplification though, normally, one or more chips are mounted on a single package substrate.

In this way, this test system can determine the overcurrent detection current accurately by measurement and calculation of Isense. The reference current Id1 required for the measurement is much lower than the current level of the actual overcurrent condition. The reference current Id1 is lower than the allowable current of the probe test. Therefore, this test process enables a test of the overcurrent detecting function in the state of a wafer.

The circuit configuration according to the embodiment of the present invention enables a package test for the overcurrent detection function by using the reference current Id1 of such a small current magnitude as not to deteriorate the life of a socket. For example, it is possible to provide a bonding wire for each of the pads 11, 12 and 13, and package the chip 25. The thus-obtained packaged device is adequate for the test process of this embodiment.

Therefore, the test system or process can solve the problem of short durability of a socket in package test, and enables a test of the overcurrent detecting function by a probe test in the state of a wafer.

Figure 3:
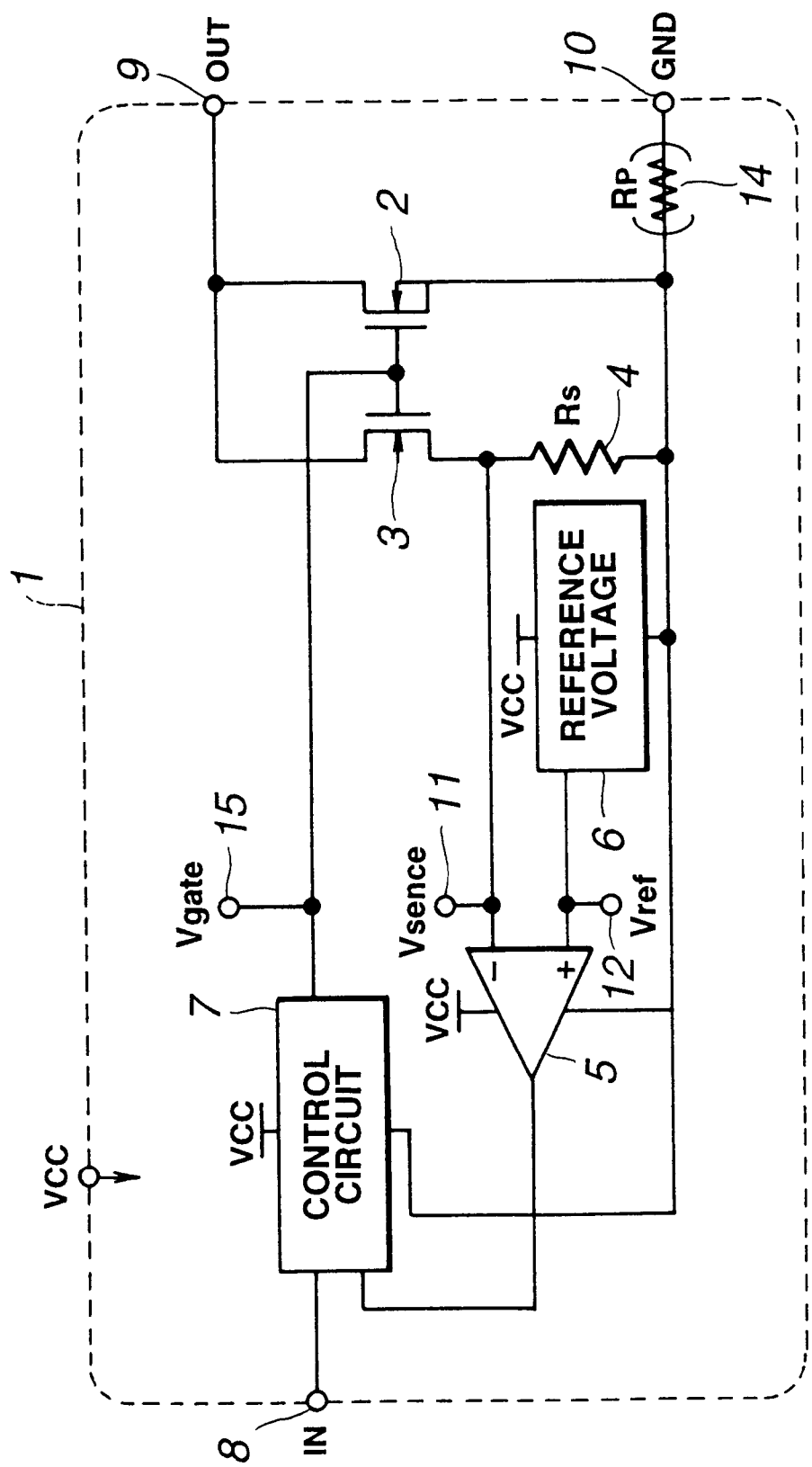
FIG. 3 is a circuit diagram showing an overcurrent detecting circuit of a second practical example according to the embodiment of the present invention.

FIG. 3 shows another practical example according to the embodiment of the present invention. The circuit of this example comprises a third pad 15 in place of the pad 13 of FIG. 1. The third pad 13 is connected between the output of the control circuit 7 and the gate of the main MOSFET 2. In other respects, the circuit of FIG. 1 is substantially identical to the circuit of FIG. 1. The circuit in the second practical example of FIG. 3 can detect an overcurrent condition in the same manner as in the first example of FIG. 1. The test process of the second example is different from the process of the first example only in the step of measuring the offset Voffset of the comparator 6.

In the offset measuring step of the second example, the offset Voffset of the comparator 5 is measured by applying external potentials to the first and second pads 11 and 12 while monitoring the potential at the third pad 15 between the output of the control circuit 7 and the gate of the main MOSFET in the state in which the main MOSFET 2 is put in the on state by supplying an input drive signal to the input terminal 8. The measurement of the offset Voffset in the second embodiment is fundamentally the same as the measurement of the first example. In response to the input drive signal to turn on the main MOSFET 2, the control circuit 7 is in the state to deliver the control signal to turn on the main MOSFET 2. In this example, the test system holds the voltage supplied to the first pad 11 equal to zero V, varies the voltage applied to the second pad 12 gradually or in a stepwise manner, and determines the voltage of the pad 12 at which the output of the control circuit 7 changes from the turn-on state to turn on the main MOSFET 2 to the turn-off state to turn off the main MOSFET 2. The offset voltage Voffset is the thus-determined value of the voltage applied to the pad 12 at the time of change of the turn-on state to the turn-off state of the control circuit 7.

The third pad 15 of the second example shown in FIG. 3 is connected with the gate of the main MOSFET 2 and the gate of the mirror MOSFET 3. Therefore, the third pad 15 can be further used for gate screening to remove initial defective units and potential defective units by applying a high voltage to a gate oxide film in the semiconductor fabricating process. The pad 15 can be used for both the test of overcurrent detection function and the gate screening. This contributes to the reduction of semiconductor chip size.

What is claimed is:

1. An integrated circuit device with overcurrent detecting function, comprising:

a main MOSFET for driving a load, the main MOSFET comprising a drain for connection to the load, a source connected to a ground terminal and a gate;

a mirror MOSFET for conducting a fraction of a current of the main MOSFET, the mirror MOSFET comprising a gate connected with the gate of the main MOSFET, a drain connected with the drain of the main MOSFET, and a source;

a current sensing resistor connected between the source of the mirror MOSFET and the ground terminal;

a reference voltage source comprising an output for providing a reference voltage;

a comparator comprising a first input connected with the source of the mirror MOSFET, a second input connected with the output of the reference voltage source, and a comparator output for delivering a comparator output signal;

a control circuit section which is connected between the output of the comparator and the gate of the main MOSFET and which comprises a control subsection for turning the main MOSFET on and off in response to an external drive signal and the comparator output signal; and a pad group comprising a first pad connected with the source of the mirror MOSFET, a second pad connected with the output of the reference voltage source, and a third pad connected with the control circuit section.

2. The integrated circuit device as claimed in claim 1:

wherein the first pad is a first intermediate pad connected with a first intermediate point between the source of the mirror MOSFET and the first input of the comparator, and adapted to sense a potential of the source terminal of the mirror MOSFET, the second pad is a second intermediate pad connected with a second intermediate point between the output of the reference voltage source and the second input of the comparator, and adapted to sense a potential of the output of the reference voltage source, and the third pad is a third intermediate pad is adapted to detect a change of the comparator output signal of the comparator; and wherein the mirror MOSFET is sized so that a mirror current flowing through the mirror MOSFET is 1/n of a main current flowing through the main MOSFET, and the main MOSFET, the mirror MOSFET, the current sensing resistor, the reference voltage source, the comparator, the control circuit and the pad group are all formed in and on a single semiconductor chip.

3. The integrated circuit device as claimed in claim 2 wherein the third pad is connected with the control circuit section at a position to detect a condition change of the control circuit section caused by a change in the comparator output signal of the comparator.

4. The integrated circuit device as claimed in claim 3 wherein the third pad is connected with one of a first subsection between the output of the comparator and the control subsection and a second subsection between the control subsection and the gate of the main MOSFET.

5. The integrated circuit device as claimed in claim 4 wherein the integrated circuit device comprises a terminal group comprising the ground terminal connected with the source of the main MOSFET, an input terminal connected with the control subsection and an output terminal for connecting the drain of the main MOSFET with the load; and wherein the control subsection comprises a first input connected with the input terminal of the integrated circuit device, a second input connected with the output of the comparator and an output connected with the gate of the main MOSFET, the first subsection includes a conductor line connecting the output of the comparator to the second input of the control subsection, the second subsection includes a conductor connecting the output of the control subsection to the gate of the main MOSFET, and the third pad is connected with one of the conductor lines of the first and second subsection.

6. An integrated circuit device as claimed in claim 5 wherein the integrated circuit device comprises a semiconductor chip in which the main MOSFET, the mirror MOSFET, the comparator and the control circuit section are integrated; a package substrate on which the semiconductor chip is mounted; a first bonding wire connecting the input terminal with a first package pad formed in the package substrate, a second bonding wire connecting the output terminal with a second package pad formed in the package substrate, and a third bonding wire connecting the ground terminal with a third package pad formed in the package substrate.

7. The integrated circuit device as claimed in claim 6 wherein the third pad is connected with the first subsection between the output of the comparator and the second input of the control subsection.

8. The integrated circuit device as claimed in claim 6 wherein the third pad is connected with the second subsection between the output of the control subsection and the gate of the main MOSFET.

9. A test system for testing overcurrent detecting function of an integrated circuit device comprising a main MOSFET for driving a load, the main MOSFET comprising a drain for connection to the load, a source connected to a ground terminal and a gate, a mirror MOSFET for conducting a fraction of a current of the main MOSFET, the mirror MOSFET comprising a gate connected with the gate of the main MOSFET, a drain connected with the drain of the main MOSFET, and a source, a current sensing resistor connected between the source of the mirror MOSFET and the ground terminal, a reference voltage source comprising an output for providing a reference voltage, a comparator comprising a first input connected with the source of the mirror MOSFET, a second input connected with the output of the reference voltage source, and a comparator output for delivering a comparator output signal, and a control circuit section which is connected between the output of the comparator and the gate of the main MOSFET and which comprises a control subsection for turning the main MOSFET on and off in response to an external drive signal and the comparator output signal, the test system comprising:

a probe subsystem for making electrical connection with each of first, second and third pads to measure a potential at each of the first, second and third pads which are formed in the integrated circuit device in such a manner that the first pad is connected with the source of the mirror MOSFET, the second pad is connected with the output of the reference voltage source, and the third pad is connected with the control circuit section; and a test control subsystem for measuring an on-state first pad potential (Vsense1) at the first pad with the probe subsystem in a state in which the main MOSFET is in an on state and a predetermined reference current (Id1) is supplied to the drain of the main MOSFET, for measuring an off-state second pad potential (Vref0) at the second pad with the probe subsystem in a state in which the main MOSFET is in an off state, for measuring an on-state second pad potential (Vref1) at the second pad with the probe subsystem in a state in which the main MOSFET is in the on state and the predetermined reference current (Id1) is supplied to the drain of the main MOSFET, for measuring an offset (Voffset) of the comparator by applying an external first potential to the first pad and an external second potential to the second pad while monitoring a potential at the third pad with the probe subsystem, and for calculating a detection current valve (Isense) given by:

$$Isense=Id1\times(Vref0-Voffset)/[Vsense1-(Vref1-Vref0)].$$

10. The test system as claimed in claim 9 wherein the test control subsystem is configured to put the probe subsystem in one of a first measuring state for inputting a turn-on drive signal to the control subsection from an input terminal of the integrated circuit device to put the main MOSFET in the on state, applying the reference current (Id1) to the drain of the main MOSFET from an output terminal of the integrate circuit device and delivering a measurement signal indicative of the on-state first pad potential (Vsense1) from the first pad to the test control subsystem, a second measuring state for inputting a turn-off drive signal to the control subsection from the input terminal of the integrated circuit device to put the main MOSFET in the off state and delivering a measurement signal indicative of the off-state second pad potential (Vref0) from the second pad to the test control subsystem, a third measurement state for inputting the turn-on drive signal to the control subsection from the input terminal of the integrated circuit device to put the main MOSFET in the on state, applying the reference current (Id1) to the drain of the main MOSFET from the output terminal of the integrate circuit device and delivering a measurement signal indicative of the on-state second pad potential (Vref1) from the second pad to the test control subsystem, and a fourth measurement state for applying the first potential to the first pad and the second potential to the second pad and for transmitting a third pad potential signal indicative of the potential at the third pad from the third pad to the control subsystem to enable the test control subsystem to detect a potential change at the third pad which is connected with the control circuit section at a position to detect a potential change at the output of the comparator.

11. The test system as claimed in claim 10 wherein the test control subsystem comprises a tester unit, and the probe subsystem comprises a first probe for sensing a potential of the source of the mirror MOSFET by touching the first pad, a second probe for sensing a potential at the output of the reference voltage source by touching the second pad, and a third probe for detecting a condition change in the control circuit section to detect a condition change of the output of the comparator by touching the third pad; and wherein the control subsystem is configured to increase the second potential applied to the second pad while holding the first potential applied to the first pad at a constant value, and determining a value of the second potential when the potential change at the third pad is detected.

12. The test system as claimed in claim 11 wherein the probe subsystem further comprises a fourth probe for sending one of the turn-on drive signal and the turn-off drive signal from the tester to the input terminal of the integrated circuit device and a fifth probe for applying the reference current (Id1) from the tester to the output terminal of the integrated circuit device.

13. A test process for testing overcurrent detecting function of an integrated circuit device comprising a main MOSFET for driving a load, the main MOSFET comprising a drain for connection to the load, a source connected to a ground terminal and a gate, a mirror MOSFET for conducting a fraction of a current of the main MOSFET, the mirror MOSFET comprising a gate connected with the gate of the main MOSFET, a drain connected with the drain of the main MOSFET, and a source, a current sensing resistor connected between the source of the mirror MOSFET and the ground terminal, a reference voltage source comprising an output for providing a reference voltage, a comparator comprising a first input connected with the source of the mirror MOSFET, a second input connected with the output of the reference voltage source, and a comparator output for delivering a comparator output signal, and a control circuit section with is connected between the output of the comparator and the gate of the main MOSFET and which comprises a control subsection for turning the main MOSFET on and off in response to an external drive signal and the comparator output signal, the test process comprising:

a measuring step of making electrical connection with each of first, second and third pads with a probe system to measure a potential at each of the first, second and third pads which are formed in the integrated circuit device in such a manner that the first pad is connected with the source of the mirror MOSFET, the second pad is connected with the output of the reference voltage source, and the third pad is connected with the control circuit section, the measuring step comprising a first sub-step for measuring an on-state first pad potential Vsense1 at the first pad in a state in which the main MOSFET is in an on state and a predetermined reference current (Id1) is supplied to the drain of the main MOSFET, a second sub-step for measuring an off-state second pad potential (Vref0) at the second pad in a state in which the main MOSFET is in an off state, a third sub-step for measuring an on-state second pad potential (Vref1) at the second pad in a state in which the main MOSFET is in the on state and the predetermined reference current (Id1) is supplied to the drain of the main MOSFET, and a fourth sub-step for measuring an offset (Voffset) of the comparator by applying an external first potential to the first pad and an external second potential to the second pad while monitoring a potential at the third pad; and a calculating step of calculating a detection current value (Isense) given by;

Isense=Id1×(Vref0−Voffset)/[Vsense1−(Vref1−Vref0)].

14. The test process as claimed in claim 13 wherein the first sub-step is performed by inputting a turn-on drive signal to the control subsection from an input terminal of the integrated circuit device to put the main MOSFET in the on state, applying the reference current (Id1) to the drain of the main MOSFET from an output terminal of the integrate circuit device and delivering a measurement signal indicative of the on-state first pad potential (Vsense1) from the first pad to the test control subsystem, the second sub-step is performed by inputting a turn-off drive signal to the control subsection from the input terminal of the integrated circuit device to put the main MOSFET in the off state and delivering a measurement signal indicative of the off-state second pad potential (Vref0) from the second pad to the test control subsystem, the third sub-step is performed by inputting the turn-on drive signal to the control subsection from the input terminal of the integrated circuit device to put the main MOSFET in the on state, applying the reference current (Id1) to the drain of the main MOSFET from the output terminal of the integrate circuit device and delivering a measurement signal indicative of the on-state second pad potential (Vref1) from the second pad to the test control subsystem, and the fourth sub-step is performed by applying the first potential to the first pad and the second potential to the second pad and detecting a potential change at the third pad which is connected with the control circuit section at a position to detect a potential change at the output of the comparator.

15. The test process as claimed in claim 14 wherein the fourth sub-step is performed by increasing the second potential applied to the second pad while holding the first potential applied to the first pad at a constant value, and determining a value of the second potential when the potential change at the third pad is detected.

16. The test process as claimed in claim 15 wherein the fourth sub-step is performed by increasing the second potential applied to the second pad while holding the first potential applied to the first pad at a constant value, and holding the main MOSFET in the on state and monitoring the potential at the third pad which is connected with the gate of the main MOSFET, and determining the value of the second potential when the potential change at the third pad is detected.

17. A test process for testing overcurrent detecting function of an integrated circuit device which comprise a main MOSFET for driving a load, the main MOSFET comprising a drain for connection to the load, a source connected to a ground terminal and a gate, a mirror MOSFET for conducting a fraction of a current of the main MOSFET, the mirror MOSFET comprising a gate connected with the gate of the main MOSFET, a drain connected with the drain of the main MOSFET, and a source, a current sensing resistor connected between the source of the mirror MOSFET and the ground terminal; a reference voltage source comprising an output for providing a reference voltage, a comparator comprising a first input connected with the source of the mirror MOSFET, a second input connected with the output of the reference voltage source, and a comparator output for delivering a comparator output signal, and a control circuit section which is connected between the output of the comparator and the gate of the main MOSFET and which comprises a control subsection for turning the main MOSFET on and off in response to an external drive signal and the comparator output signal, the test process comprising:

a first step of measuring an on-state first comparator input potential (Vsense1) at the first input of the comparator in a predetermined on state in which the main MOSFET is in an on state and a predetermined reference current (Id1) is supplied to the drain of the main MOSFET;

a second step of measuring an off-state second comparator input potential (Vref0) at the second input of the comparator in an off state in which the main MOSFET is in an off state;

a third step of measuring an on-state second comparator input potential (Vref1) at the second pad in the on state in which the main MOSFET is in the on state and the predetermined reference current (Id1) is supplied to the drain of the main MOSFET;

a fourth step of measuring an offset (Voffset) of the comparator by applying an external first potential to the first input and an external second potential to the second input while monitoring a condition of the control circuit section to detect a change at the output of the comparator; and a fifth step of calculating a detection current value (Isense) given by;

$$Isense = Id1 \times (Vref0 - Voffset) / [Vsense1 - (Vref1 - Vref0)].$$

* * * * *